(12) United States Patent
Ikezawa

(10) Patent No.: US 6,577,173 B2
(45) Date of Patent: Jun. 10, 2003

(54) INDUCTIVE LOAD DRIVING CIRCUIT

(75) Inventor: Katsuya Ikezawa, Osaka (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/044,889

(22) Filed: Jan. 11, 2002

(65) Prior Publication Data

US 2002/0109477 A1 Aug. 15, 2002

(30) Foreign Application Priority Data

Jan. 11, 2001 (JP) .......................... 2001-003152

(51) Int. Cl.$^7$ .............................................. H03K 17/16
(52) U.S. Cl. ...................................... 327/110; 327/108
(58) Field of Search ................................. 327/108, 110, 327/427, 109

(56) References Cited

U.S. PATENT DOCUMENTS 5,699,000 A * 12/1997 Ishikuri ....................... 327/108
5,801,550 A * 9/1998 Tanaka et al. ................. 326/87

FOREIGN PATENT DOCUMENTS

JP          405304452      * 11/1993

* cited by examiner

Primary Examiner—Dinh T. Le
(74) Attorney, Agent, or Firm—William H. Kempler; W. James Brady, III; Frederick J. Telecky, Jr.

(57) ABSTRACT

The objective of the invention is to provide an inductive load driving circuit that can prevent occurrence of surge voltage. Output transistor 5 and auxiliary transistor 6 are connected in parallel with each other. When output transistor 5 is turned off, auxiliary transistor 6 is kept on. The energy remaining in inductive load 26 is consumed with current flowing to auxiliary transistor 6. When the output transistor is turned off after the current flowing to output transistor 5 has attenuated, since the counterelectromotive force occurring in inductive load 26 is small, the counterelectromotive power can be clamped by the threshold voltage of auxiliary transistor 6.

15 Claims, 3 Drawing Sheets

FIG. 5
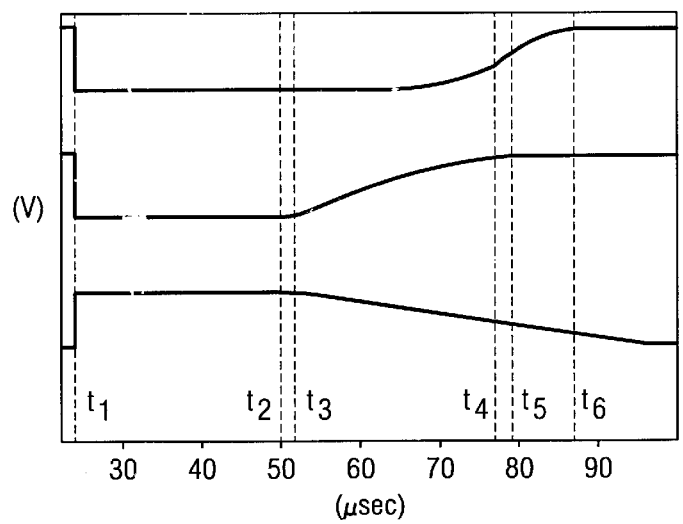
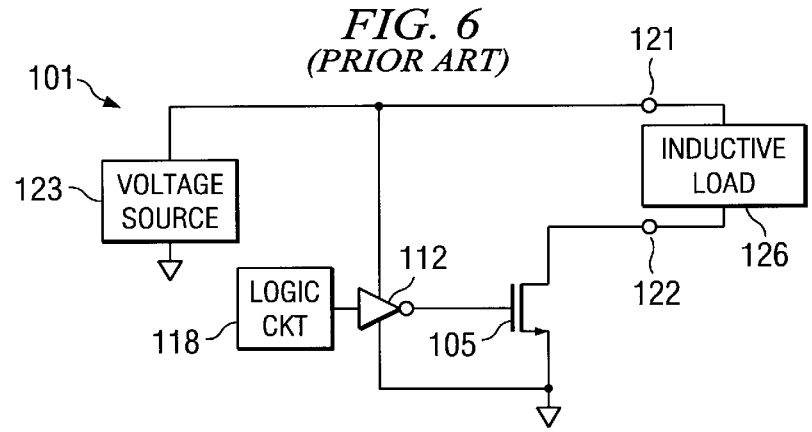
FIG. 6
*(PRIOR ART)*
FIG. 7
*(PRIOR ART)*
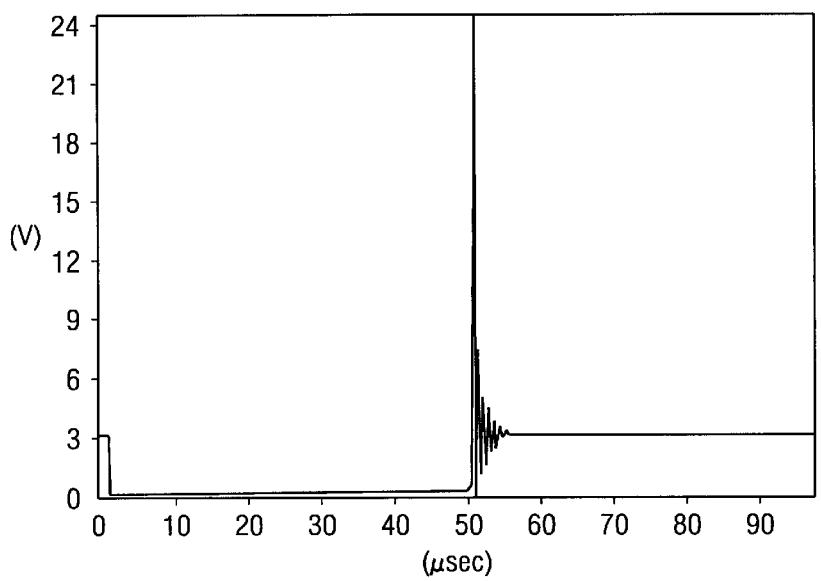

INDUCTIVE LOAD DRIVING CIRCUIT

FIELD OF THE INVENTION

The present invention pertains to an inductive load driving circuit for supplying current to an inductive load. In particular, the present invention pertains to a technology for preventing occurrence of surge voltage caused by the counterelectromotive force of the inductive load.

BACKGROUND OF THE INVENTION

Conventionally, an inductive load supply circuit has been used widely to supply current to an inductive load, such as the winding in a motor.

Its operation theory will be explained using inductive load driving circuit 101 shown in FIG. 6.

Said inductive load driving circuit 101 has an output transistor 105 made of an n-channel MOSFET, a transistor control circuit 118 that operates said output transistor 105, and an inverter 112 that is inserted between the output terminal of transistor control circuit 118 and the gate terminal of output transistor 105 to invert the output signal of transistor control circuit 118 and then send it to the gate terminal.

Symbol 121 represents the output terminal on the high potential side of said inductive load driving circuit 101, while symbol 122 represents the output terminal on the low potential side. A positive voltage output from DC voltage source 123 is applied to the high-potential output terminal 121. The drain terminal of output transistor 105 is connected to the low-potential output terminal 122.

A load 126 is connected between high-potential output terminal 121 and low-potential output terminal 122. When output transistor 105 is turned on and low-potential output terminal 122 is grounded, a current is supplied from DC voltage source 123 to load 126.

When output transistor 105 is converted from on to off, the current flowing to load 126 is stopped.

Since the current flowing to load 126 can be controlled with the on and off state of output transistor 105 as described above, the magnitude of the average current flowing to load 126 can be maintained at a constant level by keeping the on period and off period of output transistor 105 as well as their ratio constant.

However, since load 126 is inductive, an induced electromotive force with positive polarity is generated at low-potential output terminal 122 when output transistor 105 is converted from the off state to the on state.

FIG. 7 shows the variation in the voltage of low-potential output terminal 122. The peak near 50 μsec in the diagram is a surge voltage caused by the induced electromotive force. Since the surge voltage will damage output transistor 105 and cause malfunction of other circuits, it is necessary to use a different diode outside inductive load driving circuit 101 to absorb the surge voltage. As a result, the cost will be increased, and it becomes difficult to miniaturize the circuit.

The objective of the present invention is to solve the aforementioned problems by providing an inductive load driving circuit that generates no surge voltage.

SUMMARY OF INVENTION

In order to realize the aforementioned objective, the present invention provides an inductive load driving circuit having a main transistor for supplying a current path to an inductive load, an auxiliary transistor that is connected in parallel with the aforementioned main transistor, and a control circuit, which has a first driver that supplies a first control signal to the control terminal of the aforementioned main transistor, a first wave shaping circuit that blunts the rising and falling characteristics of the aforementioned first control signal, a second driver that supplies a second control signal to the aforementioned auxiliary transistor, and a second wave shaping circuit that blunts the rising and falling characteristics of the aforementioned second control signal, and which can turn on/off both the aforementioned main transistor and auxiliary transistor.

In the inductive load driving circuit of the present invention, the aforementioned first wave shaping circuit has a first capacitor connected to the control terminal of the aforementioned main transistor, while the second wave shaping circuit has a second capacitor connected to the control terminal of the aforementioned auxiliary transistor.

Also, in the inductive load driving circuit of the present invention, the aforementioned first wave shaping circuit has a first resistor for restricting current to blunt the waveform of the aforementioned first control signal when turning off the aforementioned main transistor, and the aforementioned second wave shaping circuit has a second resistor for restricting current to blunt the waveform of the aforementioned second control signal when turning off the aforementioned auxiliary transistor.

In the inductive load driving circuit of the present invention, the aforementioned main transistor consists of an n-channel MOS transistor, while the aforementioned auxiliary transistor consists of a p-channel MOS transistor.

In addition, in the inductive load driving circuit of the present invention, the on/off timing of the aforementioned main transistor and auxiliary transistor are staggered.

In the aforementioned configuration, since the off timing of the auxiliary transistor is staggered, for example, delayed from the off timing of the main (output) transistor, the auxiliary transistor can release the energy remaining in the inductive load.

Also, when the source terminal of the auxiliary transistor is connected to the terminal where the counterelectromotive force of the inductive load occurs, even if a counterelectromotive force occurs in the inductive load when the output transistor is turned off, the magnitude of the counterelectromotive force can be clamped by the threshold voltage between the source terminal and gate terminal of the auxiliary transistor.

Also, the output transistor can be turned off slowly, and the current flowing to the output transistor is reduced gradually. After the current flowing to the inductive load is reduced to a level that will not cause a counterelectromotive force, the auxiliary transistor is turned off.

BRIEF DESCRIPTION OF THE DRAWINGS

FIG. 5 is a timing chart explaining the operation of the inductive load driving circuit disclosed in the first example.

FIG. 6 is a diagram illustrating an example of a conventional inductive load driving circuit.

FIG. 7 is a diagram explaining surge voltage of the conventional inductive load driving circuit.

REFERENCE NUMERALS AND SYMBOLS AS SHOWN IN THE DRAWINGS

In the figures, 1–4 represent inductive load driving circuits, 5, 55 represent output transistors, 6, 56 represent auxiliary transistors, 7, 57 represent transistor control circuits, and 26, 76 represent inductive loads.

DESCRIPTION OF EMBODIMENTS

In the following, embodiments of the present invention will be explained with reference to figures.

Figure 1:
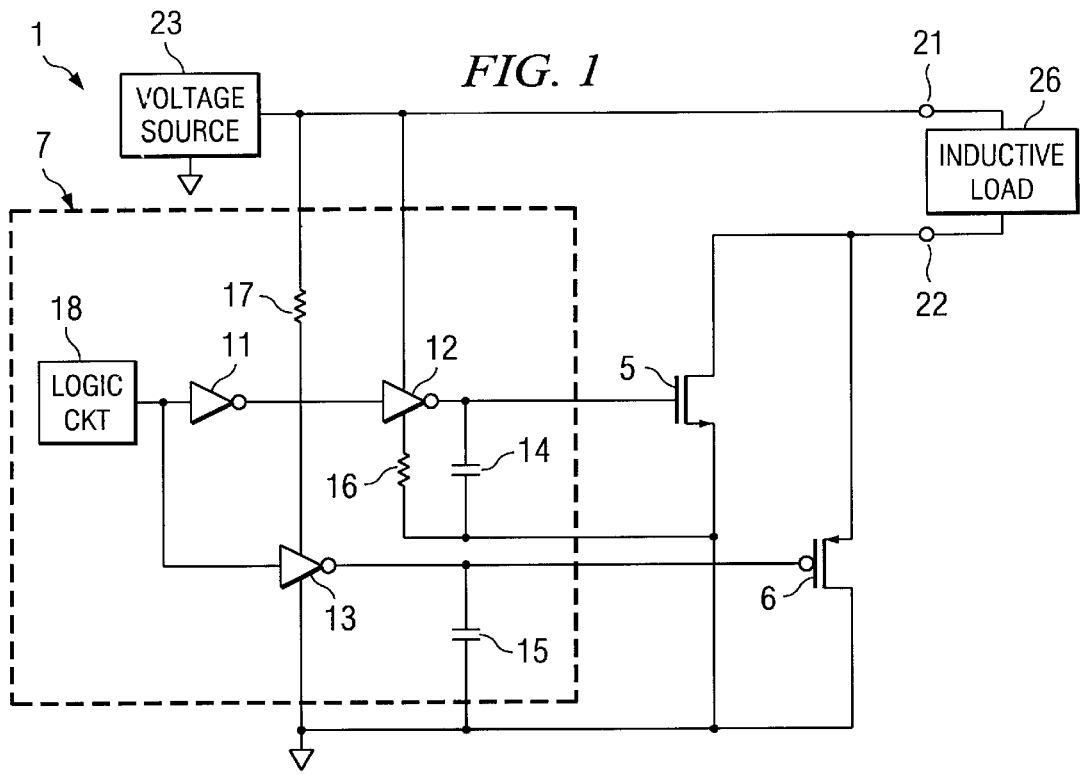
FIG. 1 is a circuit diagram illustrating the first example of the inductive load driving circuit disclosed in the present invention.

In FIG. 1, 1 represents a first example of the inductive load driving circuit disclosed in the present invention.

Said inductive load driving circuit 1 has output transistor 5, auxiliary transistor 6, transistor control circuit 7, high-potential output terminal 21, and low-potential terminal 22.

Said output transistor 5 consists of an n-channel MOSFET, while auxiliary transistor 6 consists of a p-channel MOSFET.

Output transistor 5 and auxiliary transistor 6 are connected in parallel with each other. Both the source terminal of output transistor 5 and the drain terminal of auxiliary transistor 6 are grounded. Both the drain terminal of output transistor 5 and the source terminal of auxiliary transistor 6 are connected to low-potential output terminal 22.

A DC voltage source 23 that outputs positive voltage is connected to high-potential output terminal 21. When output transistor 5 is turned on with a load connected between high-potential output terminal 21 and low-potential output terminal 22, low-potential output terminal 22 is grounded, and a current is supplied from DC voltage source 23 to load 26.

The operation of output transistor 5 and auxiliary transistor 6 is controlled by transistor control circuit 7.

In the following, the internal configuration of transistor control circuit 7 will be explained. In transistor control circuit 7, there are first-third inverters 11–13, first and second capacitors 14 and 15, first and second resistors 16 and 17, and logic circuit 18.

First and second inverters 11 and 12 are connected in series to invert the logic signal output from logic circuit 18 twice, and the inverted signal is sent to the gate terminal of output transistor 5.

The logic signal output from logic circuit 18 is also input to a third inverter 13. The signal inverted by third inverter 13 is output to the gate terminal of auxiliary transistor 6.

Consequently, if the logic signal output from logic circuit 18 is at a high level, a signal of high level will be input to the gate terminal of output transistor 5, while a signal of low level will be input to the gate terminal of auxiliary transistor 6.

On the other hand, if the logic signal output from logic circuit 18 is at a low level, a signal of low level is input to the gate terminal of output transistor 5, while a signal of high level will be input to the gate terminal of auxiliary transistor 6.

The output terminals of the second and third inverters 12 and 13 are grounded via the first and second capacitors 14 and 15, respectively.

For the internal circuit of the second inverter 12, its power supply terminal is directly connected to DC voltage source 23, while its ground terminal is grounded via the first resistor 16. On the other hand, the power supply terminal of the internal circuit of the third inverter 13 is connected to DC voltage source 23 via the second resistor 17, while its ground terminal is directly grounded.

As a result, the current pulled by the second inverter 12 and the current discharged by the third inverter 13 are restricted by the first and second resistors 16 and 17, respectively.

When logic circuit 18 outputs a high signal, the second and third inverters 12 and 13 output a high signal and a low signal, respectively, and output transistor 5 and auxiliary transistor 6 are in the on state while the first capacitor 14 is charged by the high signal, while the second capacitor 15 is discharged by the low signal.

When the output signal of logic circuit 18 is inverted from that state, the second inverter 12 pulls in current and operates in the direction for lowering the voltage at the gate terminal of output transistor 5. Also, the third inverter 13 discharges current and operates in the direction for raising the potential at the gate terminal of auxiliary transistor 6.

At that time, since the current pulled by the second inverter 12 and the current discharged by the third inverter 13 are restricted by the first and second resistors 16 and 17, the voltage at the gate terminal of output transistor 5 drops slowly, while the voltage at the gate terminal of auxiliary transistor 6 rises slowly. As a result, since output transistor 5 and auxiliary transistor 6 switch slowly from the on state to the off state, the current flowing to output transistor 5 and the current flowing to auxiliary transistor 6 are reduced gradually.

On the side of output transistor 5, the circuit formed by combining the first capacitor represented by symbol 14 and the first resistor represented by symbol 16 acts as a delay circuit that gradually reduces the current flowing to output transistor 5. On the side of auxiliary transistor 6, the circuit formed by combining the second capacitor represented by symbol 15 and the second resistor represented by symbol 17 acts as a delay circuit that gradually reduces the current flowing to auxiliary transistor 6.

In the following, the operation of inductive load driving circuit 1 disclosed in the present invention will be explained. When the output signal of logic circuit 18 switches from high level to low level, since the capacitance of the first capacitor 14 is smaller than that of the second capacitor 15, first, the voltage at the gate terminal of output transistor 5 drops slowly, and the current flowing to load 26 reduces gradually.

Load 26 is the winding of a small motor that drives the vibrator in a cellular phone. It is an inductive load. Therefore, when the current is cut off abruptly, a counter-electromotive force will be generated, and the potential at low-potential output terminal 22 will rise quickly. However, when the current flowing to load 26 is reduced gradually as described above, a small or no counterelectromotive force will be generated. Even if a small electromotive force is generated, it can be handled with a low voltage.

When the current flowing to load 26 is sufficiently reduced, the voltage at the gate terminal of auxiliary transistor 6 becomes sufficiently high, and the current flowing to auxiliary transistor 6 is also reduced.

When output transistor 5 is turned off completely, if the current flowing to output transistor 5 is reduced sufficiently, no counterelectromotive force will be generated in load 26.

Even if a counterelectromotive force is generated, when output transistor 5 is turned off completely, the voltage at the gate terminal of auxiliary transistor 6 is not fully raised, and a very small current flows in auxiliary transistor 6 to maintain the on state.

When auxiliary transistor 6 is kept on with a very small current, the voltage at the source terminal of auxiliary transistor 6 is equal to the voltage calculated by adding the threshold voltage $V_{TP}$ of auxiliary transistor 6 to the voltage at the gate terminal.

When an induced electromotive force is generated at low-potential output terminal 22, the potential at the source terminal of auxiliary transistor 6, that is, the potential at low-potential output terminal 22 is clamped by the voltage calculated by adding threshold voltage $V_{TP}$ to the voltage at the gate terminal of auxiliary transistor 6.

Since the voltage at the gate terminal of auxiliary transistor 6 cannot be higher than the voltage applied from DC voltage source 23, the potential at low-potential output terminal 22 can only be raised to a maximum level that is equal to the sum of threshold voltage $V_{TP}$ and the voltage output from DC voltage source 23.

The magnetic energy stored in load 26 is released completely. The potential at low-potential output terminal 22 drops, and the voltage difference between the source terminal and gate terminal of auxiliary transistor 6 also drops below threshold voltage $V_{TP}$. At that time, auxiliary transistor 6 is turned off, and the current flowing to load 26 becomes zero.

As described above, even if a counterelectromotive force is generated when output transistor 5 is turned off, the potential at low-potential output terminal 22 can be clamped by keeping auxiliary transistor 6 in the on state to prevent occurrence of surge voltage.

FIG. 5 is a timing chart explaining the operation of inductive load driving circuit 1 disclosed in the present invention. $V_{22}$ represents the potential of low-potential output terminal 22. $V_{g6}$ represents the voltage at the gate terminal of auxiliary transistor 6, and $V_{g5}$ represents the voltage at the gate terminal of output transistor 5.

After output transistor 5 and auxiliary transistor 6 are turned on at time $t_1$, at time $t_2$, first, the voltage $V_{g5}$ at the gate terminal of output transistor 5 starts to drop, and output transistor 5 approaches the off state.

Then, at time $t_3$, the voltage $V_{g6}$ at the gate terminal of auxiliary transistor 6 starts to rise, and auxiliary transistor 6 approaches the off state.

After passing time $t_3$, the current flowing to load 26 is reduced gradually, and output transistor 5 is turned off completely at time $t_4$. When output transistor 5 is turned off, the current flowing to load 26 is sufficiently reduced, and the energy remaining in load 26 flows to auxiliary transistor 6.

At time $t_5$, after the voltage $V_{g6}$ at gate terminal of auxiliary transistor 6 becomes equal to the output voltage of DC voltage source 23, a small current still flows due to the counterelectromotive force of load 26 to consume the energy remaining in load 26. At time $t_6$ when the counterelectromotive force dies out, the current flowing to load 26 becomes zero. At that time, the potential at low-potential output terminal 22 becomes equal to the voltage output from DC voltage source 23.

In the inductive load driving circuit 1 disclosed in said first example, a positive voltage is applied to high-potential output terminal 21 by a DC voltage source 23. When output transistor 5 and auxiliary transistor 6 are turned on, low-potential output terminal 22 is connected to ground. The present invention, however, is not limited to this.

Figure 2:
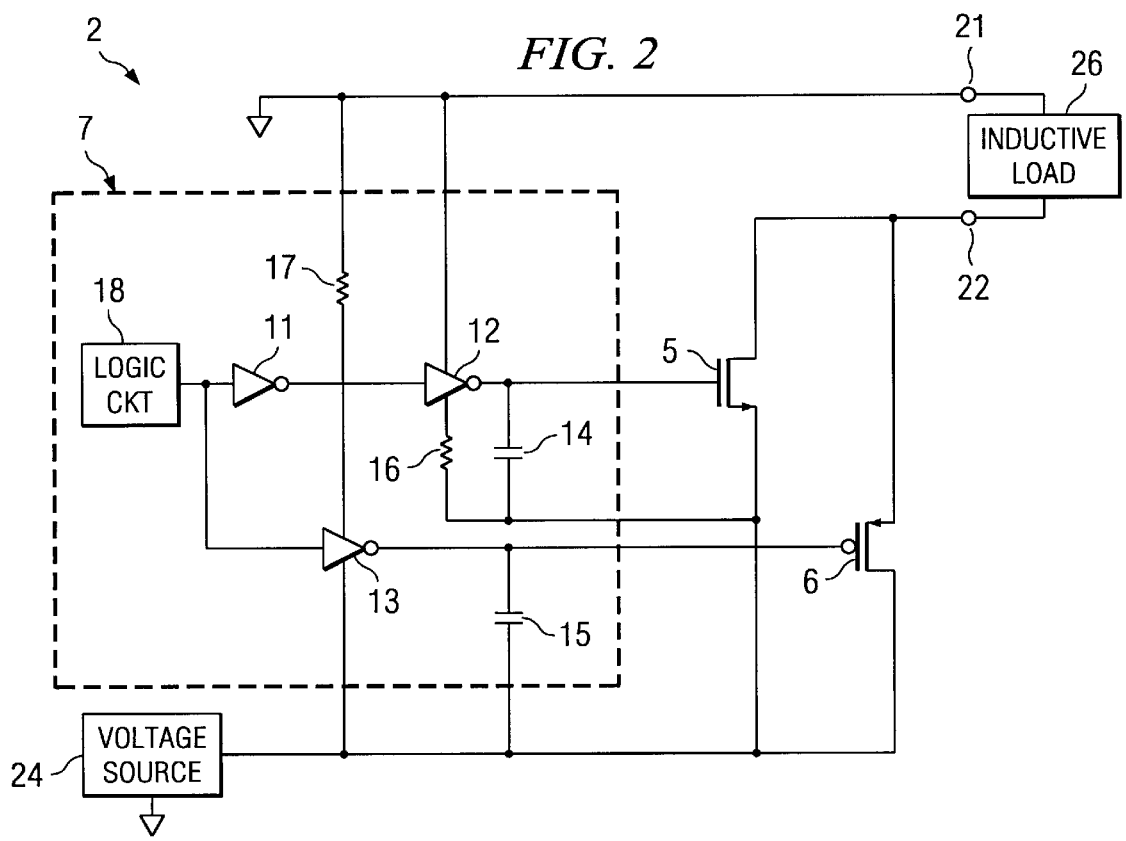
FIG. 2 is a circuit diagram illustrating the second example of the inductive load driving circuit disclosed in the present invention.

FIG. 2 shows inductive load driving circuit 2 as a second example of the present invention. This inductive load driving circuit 2 is operated by a DC voltage source 24 that outputs negative voltage instead of by DC voltage source 23 that outputs positive voltage.

In said inductive load driving circuit 2, high-potential output terminal 21 is connected to ground. On the other hand, when output transistor 5 and auxiliary transistor 6 are turned on, the negative voltage output from DC voltage source 24 is applied to low-potential output terminal 22.

The operation of said inductive load driving circuit 2 is identical to that of inductive load driving circuit 1 disclosed in the first example.

In inductive load driving circuits 1 and 2 of the first and second examples, an n-channel MOSFET is used for output transistor 5, while a p-channel MOSFET is used for auxiliary transistor 6. The present invention, however, is not limited to this.

Figure 3:
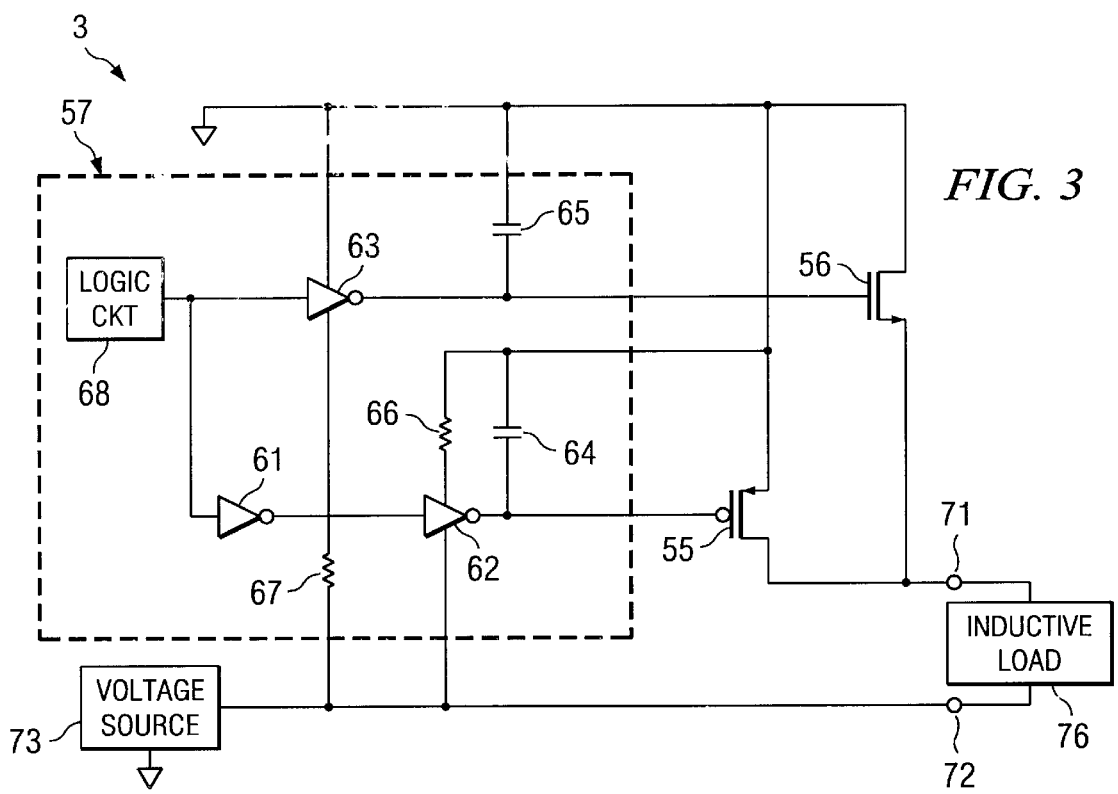
FIG. 3 is a circuit diagram illustrating the third example of the inductive load driving circuit disclosed in the present invention.

FIG. 3 shows an inductive load driving circuit 3 as a third example of the present invention. This inductive load driving circuit 3 has an output transistor 55 made of a p-channel MOSFET and an auxiliary transistor 56 made of an n-channel MOSFET.

Output transistor 55 and auxiliary transistor 56 are connected in parallel with each other. The source terminal of output transistor 55 and the drain terminal of auxiliary transistor 56 are grounded. Also, the drain terminal of output transistor 55 and the source terminal of auxiliary transistor 56 are connected to high-potential output terminal 71.

Low-potential output terminal 72 is connected to DC voltage source 73. The negative voltage output from DC voltage source 73 is applied to the low-potential output terminal.

Said output transistor 55 and auxiliary transistor 56 are controlled by transistor control circuit 57. When output transistor 55 and auxiliary transistor 56 are turned on and the high-potential output terminal is grounded, a current flows in load 76 from the ground potential toward DC voltage source 73.

The first-third inverters 61–63 in transistor control circuit 57 are the elements corresponding to the first-third inverters 11–13 of the control circuit 7 shown in FIGS. 1 and 2. The logic signal output from logic circuit 68 is sent to output transistor 55 and auxiliary transistor 56 to operate output transistor 55 and auxiliary transistor 56.

In said transistor control circuit 57, first and second capacitors 64 and 65 are inserted between the gate terminal of output transistor 55 and the ground as well as between the gate terminal of auxiliary transistor 56 and the ground, respectively.

The first and second resistors 66 and 67 connected to the second and third inverters 62 and 63 restrict the discharge current of the first capacitor 64 connected to output transistor 55 and the charging current of second capacitor 65 connected to auxiliary transistor 56, respectively. Consequently, when output transistor 55 and auxiliary transistor 56 are converted from on to off, the voltage at the gate terminal changes slowly. As a result, when output transistor 55 and auxiliary transistor 56 are converted from on to off, the currents flowing to these transistors are reduced gradually.

In the inductive load driving circuit 3 of the third example, when output transistor 55 is converted from on to off, a negative voltage is induced at high-potential output terminal 71. When output transistor 55 is turned off, auxiliary transistor 56 is turned on. The voltage at high-potential output terminal 71 is clamped by a voltage calculated by subtracting the threshold voltage $V_{TN}$ of auxiliary transistor 56 from the voltage at the gate terminal of auxiliary transistor 56. As a result, no negative surge voltage is generated.

Figure 4:
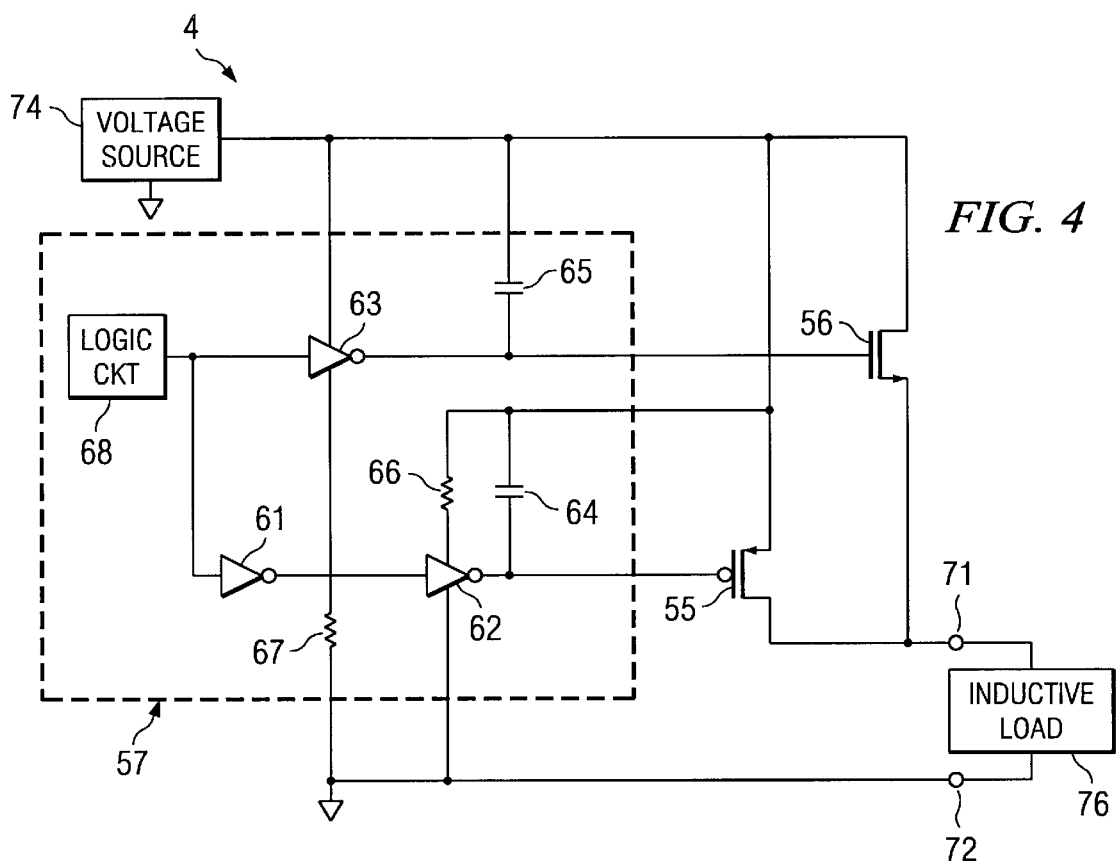
FIG. 4 is a circuit diagram illustrating the fourth example of the inductive load driving circuit disclosed in the present invention.

FIG. 4 shows inductive load driving circuit 4 as a fourth example of the present invention. In this inductive load driving circuit 4, the source terminal of output transistor 55 and the drain terminal of auxiliary transistor 56 are connected to a DC voltage source 74 that outputs positive voltage instead of to DC voltage source 73 that outputs negative voltage.

The drain terminal of output transistor 55 and the source terminal of auxiliary transistor 56 are connected to high-potential output terminal 71. Also, low-potential output terminal 72 is connected to the ground potential.

In inductive load driving circuit 4 shown in FIG. 4, a current is supplied to load 76 with the same operation as that of inductive load driving circuit 3 shown in FIG. 3.

It is obvious to specialists that in the aforementioned embodiments, the output transistor and the auxiliary transistor can be constituted with bipolar transistors, such as npn bipolar transistors and pnp bipolar transistors.

Occurrence of surge voltage caused by the counterelectromotive force of an inductive load can be prevented without using an externally attached diode.

What is claimed is:

1. An inductive load driving circuit comprising:
   a main transistor for supplying a current path to an inductive load,
   an auxiliary transistor that is connected in parallel with the main transistor, and
   a control circuit, having a first driver that supplies a first control signal to the control terminal of the main transistor, a first wave shaping circuit that slows the rise and fall of the first control signal, a second driver that supplies a second control signal to the auxiliary transistor, and a second wave shaping circuit that slows the rise and fall of the second control signal, and which turns on/off both the main transistor and auxiliary transistor, wherein the first wave shaping circuit has a first capacitor connected to the control terminal of the main transistor, and the second wave shaping circuit has a second capacitor connected to the control terminal of the auxiliary transistor.

2. The inductive load driving circuit described in claim 1 wherein the first wave shaping circuit has a first resistor for restricting current to slow changes in the first control signal when turning off the main transistor, and the second wave shaping circuit has a second resistor for restricting current to slow changes in the second control signal when turning off the auxiliary transistor.

3. The inductive load driving circuit described in claim 1 wherein the main transistor consists of an n-channel MOS transistor, and the auxiliary transistor consists of a p-channel MOS transistor.

4. The inductive load driving circuit described in claim 1 wherein the off timing of the auxiliary transistor is time delayed from the off timing of the main transistor.

5. The inductive load driving circuit described in claim 1 wherein the main transistor consists of an n-channel MOS transistor, and the auxiliary transistor consists of a p-channel MOS transistor.

6. The inductive load driving circuit described in claim 2 wherein the off the auxiliary transistor is tim delayed from the off timing of the main transistor.

7. The inductive load driving circuit described in claim 3 wherein the off timing of the auxiliary transistor is time delayed from the off timing of the main transistor.

8. The inductive load driving circuit described in claim 1 wherein the inductive load is a vibrator motor.

9. The inductive load driving circuit described in claim 1 wherein the inductive load is a vibrator motor.

10. The inductive load driving circuit described in claim 3 wherein the inductive load is a vibrator motor.

11. The inductive load driving circuit described in claim 4 wherein the inductive load is a vibrating ringer.

12. The inductive load driving circuit described in claim 1 wherein the inductive load is a vibrating ringer.

13. The inductive load driving circuit described in claim 2 wherein the inductive load is a vibrating ringer.

14. The inductive load driving circuit described in claim 3 wherein the inductive load is a vibrating ringer.

15. The inductive load driving circuit described in claim 4 wherein the inductive load is a vibrating ringer.

* * * * *